United States Patent
Yang et al.

(10) Patent No.: US 7,898,876 B2
(45) Date of Patent: Mar. 1, 2011

(54) PAGE BUFFER CIRCUIT, NONVOLATILE MEMORY DEVICE INCLUDING THE PAGE BUFFER CIRCUIT, AND METHOD OF OPERATING THE NONVOLATILE MEMORY DEVICE

(75) Inventors: Chang Won Yang, Gyeonggi-do (KR); Cheul Hee Koo, Gyeonggi-do (KR); Sam Kyu Won, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 17 days.

(21) Appl. No.: 12/493,274

(22) Filed: Jun. 29, 2009

(65) Prior Publication Data

US 2010/0142277 A1    Jun. 10, 2010

(30) Foreign Application Priority Data

Dec. 8, 2008    (KR) .................... 10-2008-0123868

(51) Int. Cl.
 *G11C 7/10*    (2006.01)
(52) U.S. Cl. .............................. 365/189.05; 365/230.08
(58) Field of Classification Search ............ 365/189.05, 365/230.08
See application file for complete search history.

(56) References Cited

U.S. PATENT DOCUMENTS 7,298,648 B2 *    11/2007    Lee et al. ................ 365/185.03

FOREIGN PATENT DOCUMENTS

KR    10-0244864    3/2000

OTHER PUBLICATIONS

Notice of Preliminary Rejection issued from Korean Intellectual Property Office on Jun. 28, 2010.

* cited by examiner

*Primary Examiner*—Hoai V Ho
*Assistant Examiner*—Jason Lappas
(74) *Attorney, Agent, or Firm*—IP & T Group LLP

(57) ABSTRACT

A page buffer circuit comprises a bit line selection unit, a latch unit, and a bit line control unit. The bit line selection unit is configured to select a bit line coupled to memory cells. The latch unit comprises a plurality of latch circuits. The plurality of latch circuits is coupled to a sense node and configured to latch data to be programmed into the memory cells or store data from the memory cells. The bit line control unit is coupled to the sense node and configured to temporarily charge a voltage of the selected bit line in response to charge and transfer control signals or transfer the charged voltage to the selected bit line.

6 Claims, 5 Drawing Sheets

PAGE BUFFER CIRCUIT, NONVOLATILE MEMORY DEVICE INCLUDING THE PAGE BUFFER CIRCUIT, AND METHOD OF OPERATING THE NONVOLATILE MEMORY DEVICE

CROSS-REFERENCE TO RELATED APPLICATION

Priority to Korean patent application number 10-2008-0123868 filed on Dec. 8, 2008, the entire disclosure of which is incorporated by reference herein, is claimed.

BACKGROUND

One or more embodiments relate to a nonvolatile memory device and, more particularly, to a page buffer circuit configured to control the program speed by checking the threshold voltage of a cell more accurately through a double verification operation using an analog method, a nonvolatile memory device including the page buffer circuit, and a method of operating the nonvolatile memory device.

A NAND flash memory device (i.e., a type of a nonvolatile memory device) includes a memory cell array, a row decoder, and a page buffer. The memory cell array includes word lines extending in rows, bit lines extending in columns, and cell strings corresponding to the respective bit lines.

The row decoder coupled to a string selection line, the word lines, and a common source line is placed on one side of the memory cell array. The page buffer coupled to the bit lines is placed on the other side of the memory cell array.

Recently, in order to further increase the degree of integration of flash memory devices, active research has been carried out on a multi-bit cell which is capable of storing plural data in one memory cell. This type of a memory cell is called a multi-level cell (MLC). A memory cell capable of storing a single bit is called a single level cell (SLC).

Each of flash memory cells of a flash memory device includes a current path, formed between a source and a drain over a semiconductor substrate, and a floating gate and a control gate formed between insulating layers over the semiconductor substrate. Further, the program operation of a flash memory cell is mainly performed by applying a high positive voltage to the control gate so that Fowler-Nordheim (F-N) tunneling is generated between the floating gate and the semiconductor substrate in the state in which the source and drain regions of the memory cell and the substrate (i.e., a bulk region) are grounded. In such F-N tunneling, an electric field of the high voltage applied to the control gate causes electrons of the bulk region to be accumulated in the floating gate, and so the threshold voltage of the memory cell rises.

A nonvolatile memory device has higher reliability when the distribution of threshold voltages of programmed memory cells is narrowed. Accordingly, it is important to narrow the distribution of threshold voltages when performing a program operation. One of the methods used to narrow the distribution of threshold voltages is a double verification method.

FIG. 1A is a diagram showing verification voltages when a double verification operation is performed in the distributions of threshold voltages, and FIG. 1B is a flowchart illustrating a program operation using the double verification operation.

Referring to FIG. 1A, a first threshold voltage distribution 110 includes erase cells, and a second threshold voltage distribution 120 includes program cells. PV1 denotes a first verification voltage, and PV2 denotes a second verification voltage.

A program operation is described below. When data to be programmed and address information input together with a program command are input, a nonvolatile memory device performs a program at step S101 and then performs a first verification operation using the first verification voltage PV1 at step S103. The nonvolatile memory device performs a second verification operation using the second verification voltage PV2 at step S105.

If, as a result of the second verification operation, all memory cells are determined to pass as programmed at step S107, the program is terminated. If, as a result of the second verification operation, however, any one of the memory cells is determined to not have been programmed, the program is performed again. Here, the voltage of a corresponding bit line is changed based on a result of the first verification operation at step S109.

That is, the result of the first verification operation is stored in the latch of the page buffer on a bit-line basis. The voltage of the bit line is changed according to a data status latched in the page buffer. A certain voltage is applied to a bit line that is determined to be a program pass as a result of the first verification operation. 0 V is applied to a bit line that is determined to be a program fail as a result of the first verification operation.

After a voltage is applied to a bit line as described above, a program voltage that is raised by as much as a set step voltage is applied to a word line according to an increment step program pulse (ISPP) method at step S111. Next, the program is performed again.

After the voltage is applied to the bit line, a speed at which a memory cell determined to have passed as programmed in the first verification operation is programmed can be made to be comparatively slow by controlling a program degree of the memory cell for the program voltage. Accordingly, the width of a distribution of threshold voltages of memory cells can be narrowed by controlling the program speed of a memory cell that is rapidly programmed as compared with the program speed of a memory cell that is comparatively slowly programmed.

However, in the double verification operation, the voltage of a bit line is changed depending on whether corresponding memory cells are determined to have passed as programmed for the first verification voltage. The double verification operation may not be used to control the voltage of a bit line more accurately according to a program degree of corresponding memory cells.

BRIEF SUMMARY

One or more embodiments relate to a page buffer circuit configured to control the voltage of a bit line in an analog manner according to a program state of corresponding memory cells when a double verification operation is performed, a nonvolatile memory device including the page buffer circuit, and a method of operating the nonvolatile memory device.

According to an aspect of this disclosure, there is provided a page buffer circuit, comprising a bit line selection unit, a latch unit, and a bit line control unit. The bit line selection unit is configured to select a bit line coupled to memory cells. The latch unit comprises a plurality of latch circuits. The plurality of latch circuits is coupled to a sense node and configured to latch data to be programmed into the memory cells or store data from the memory cells. The bit line control unit is coupled to the sense node and configured to temporarily charge a voltage of the selected bit line in response to charge and transfer control signals or transfer the charged voltage to the selected bit line.

According to another aspect of this disclosure, there is provided a page buffer circuit, comprising a bit line selection unit, a latch unit, and a bit line control unit. The bit line selection unit is configured to select a bit line coupled to memory cells. The latch unit is configured to latch data to be programmed into the memory cells or store data from the memory cells through a sense node. The bit line control unit is configured to charge a voltage of the selected bit line in response to a charge control signal when a program verification operation is performed, and when a result of the program verification operation is a fail, re-execute the program verification operation by supplying the selected bit line with the charged voltage in response to a transfer control signal.

The bit line control unit comprises voltage charge means for charging the voltage of the selected bit line; a first switching element coupled between the sense node and the voltage charge means and configured to connect the sense node and the voltage charge means in response to the charge control signal; a second switching element coupled to an input terminal of a power source voltage; and a third switching element configured to, when the second switching element transfers the power source voltage to the sense node in response to the transfer control signal, change the degree to which the third switching element is turned-on according to a voltage level charged at the voltage charge means, thus changing a voltage level transferred to the sense node.

According to yet another aspect of this disclosure, there is provided a nonvolatile memory device, comprising a memory cell array, a page buffer unit including page buffers, and a control unit. The memory cell array comprises a number of memory blocks each including memory cells for storing data. The memory cells are coupled by a bit line and a word line. The page buffers are coupled to the bit line and are configured to include a plurality of latch circuits for latching data to be programmed into the memory cells or storing data from the memory cells. Each of the page buffers comprises a bit line control unit configured to temporarily charge a voltage of a bit line varying according to a program degree of memory cells when a program verification operation is performed and to provide the bit line with the charged voltage when a program operation for the bit line is performed. The control unit is configured to control a program, read, or erase operation, charge a voltage of a bit line according to a verification result to the page buffer when a program verification operation is performed using a double verification method, and apply the bit line with the voltage charged at the page buffer when a program operation is performed.

Each of the page buffers of the page buffer unit comprises a bit line selection unit configured to select the bit line; a latch unit, comprising a plurality of latch circuits coupled to a sense node and configured to latch data to be programmed into the memory cells or store data from the memory cells; and the bit line control unit coupled to the sense node and configured to temporarily charge a voltage of the selected bit line in response to charge and transfer control signals or transfer the charged voltage to the selected bit line.

The bit line control unit comprises voltage charge means for charging the voltage of the selected bit line; a first switching element coupled between the sense node and the voltage charge means and configured to connect the sense node and the voltage charge means in response to the charge control signal; a second switching element coupled to an input terminal of a power source voltage; and a third switching element configured to, when the second switching element transfers the power source voltage to the sense node in response to the transfer control signal, change the degree to which the third switching element is turned-on according to a voltage level charged at the voltage charge means, thus changing a voltage level transferred to the sense node.

According to still yet another aspect of this disclosure, there is provided a method of operating a nonvolatile memory device, comprising a first program step of performing a program operation using a first program voltage; a first verification step of performing a first verification operation on selected memory cells using a first verification voltage and temporarily charging a voltage of a bit line coupled to the selected memory cells; a second verification step of performing a second verification operation using a second verification voltage higher than the first verification voltage; a bit line voltage change step of, if a result of the second verification operation is not a pass, precharging the bit line in proportion to the temporarily charged voltage; and a second program step of performing a program operation using a second program voltage higher than the first program voltage by as much as a step voltage.

The method further comprises, after the second program step, performing the first verification operation and the second verification operation, and if a result of the second verification operation is not a pass, performing a third program operation using a third program voltage higher than the second program voltage by as much as the step voltage after the bit line voltage change step.

If a result of the second verification operation is a pass, a program operation is terminated.

DESCRIPTION OF EMBODIMENTS

Figure 1A:
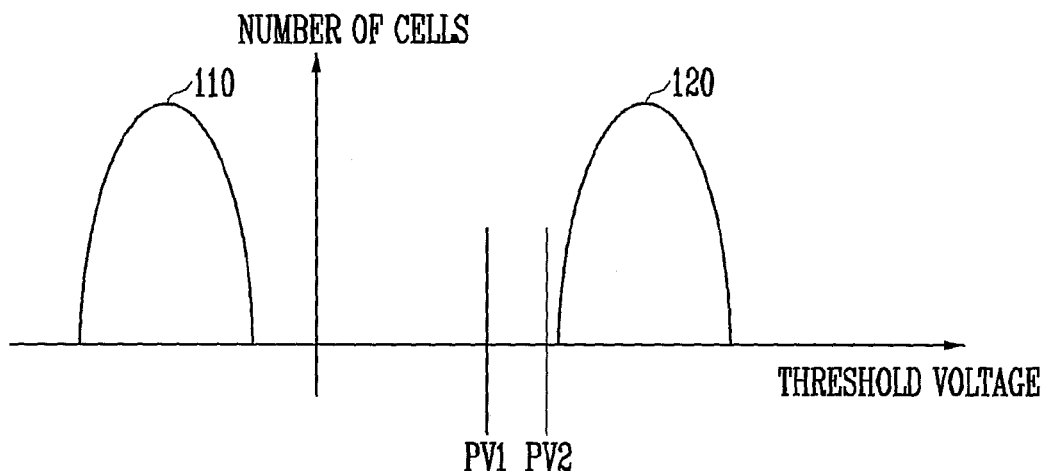
FIG. 1A is a diagram showing verification voltages when a double verification operation is performed in the distributions of threshold voltages.
Figure 1B:
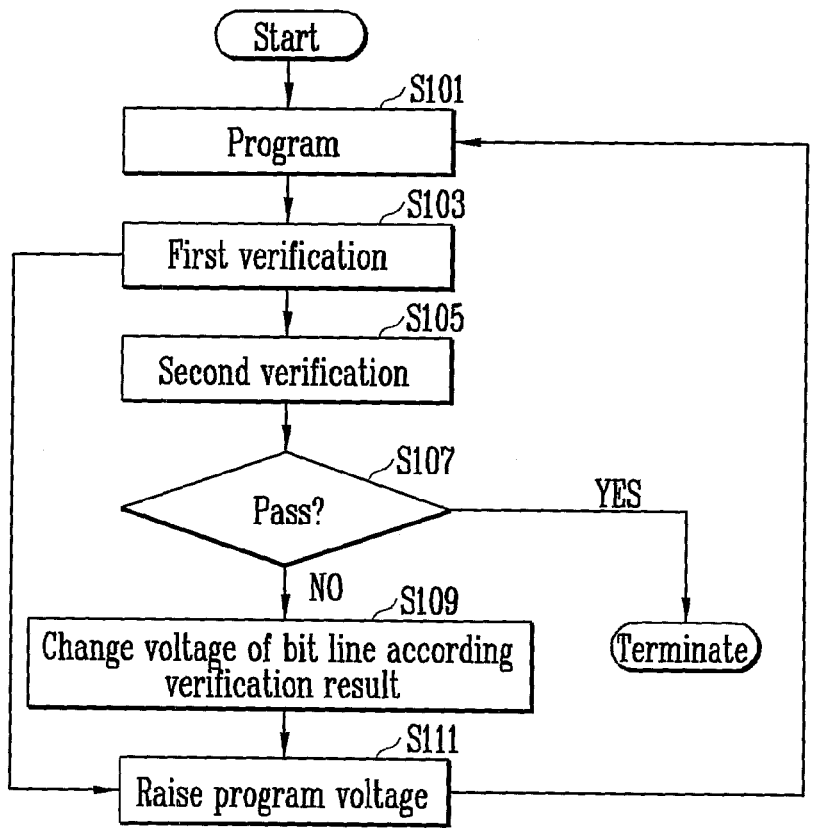
FIG. 1B is a flowchart illustrating a program operation using the double verification operation.

Hereinafter, one or more embodiments of the present disclosure will be described in detail with reference to the accompanying drawings. The drawing figures are provided to allow those having ordinary skill in the art to understand the scope of the embodiment of the disclosure.

Figure 2A:
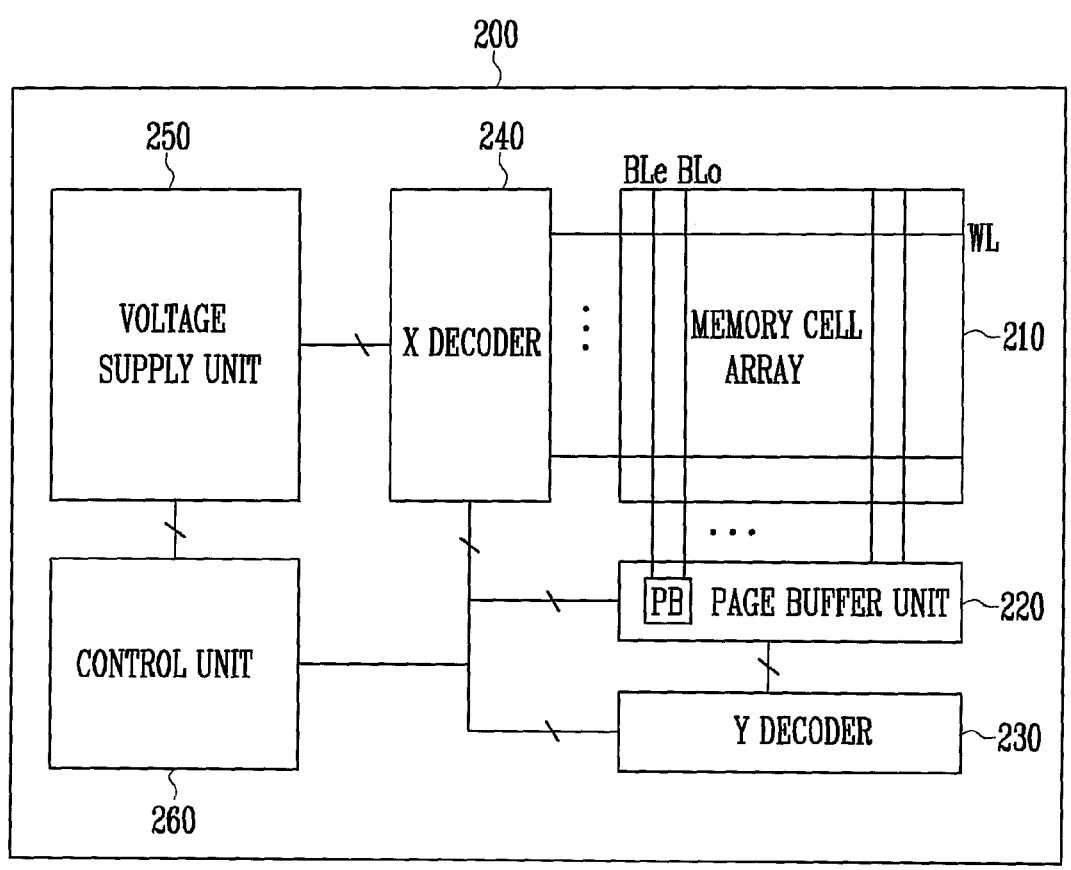
FIG. 2A is a block diagram of a nonvolatile memory device according to an embodiment.

FIG. 2A is a block diagram of a nonvolatile memory device according to an embodiment.

Referring to FIG. 2A, the nonvolatile memory device 200 according to the present embodiment includes a memory cell array 210, a page buffer unit 220, a Y decoder 230, an X decoder 240, a voltage supply unit 250, and a control unit 260.

The memory cell array 210 includes memory blocks each including memory cells for storing data. The memory cells are coupled to each other by word lines and bit lines.

The page buffer unit 220 includes page buffers PB coupled to the bit lines. The page buffer PB is configured to store data to be programmed into memory cells, coupled thereto through the bit lines, or read and store data programmed into memory cells.

The Y decoder 230 is configured to provide the page buffers PB of the page buffer unit 220 with a data I/O path. The X decoder 230 is configured to select and enable a memory block of the memory cell array 210 and couple the word lines of an enabled memory block to a global word line through which an operating voltage is supplied.

The voltage supply unit 250 is configured to generate an operating voltage supplied to the global word line. The control unit 260 is configured to control the page buffer unit 220, the Y decoder 230, the X decoder 240, and the voltage supply unit 250.

The page buffer PB is configured to control the voltage of a bit line according to a program state of corresponding memory cells in a program operation and include the following circuits.

Figure 2B:
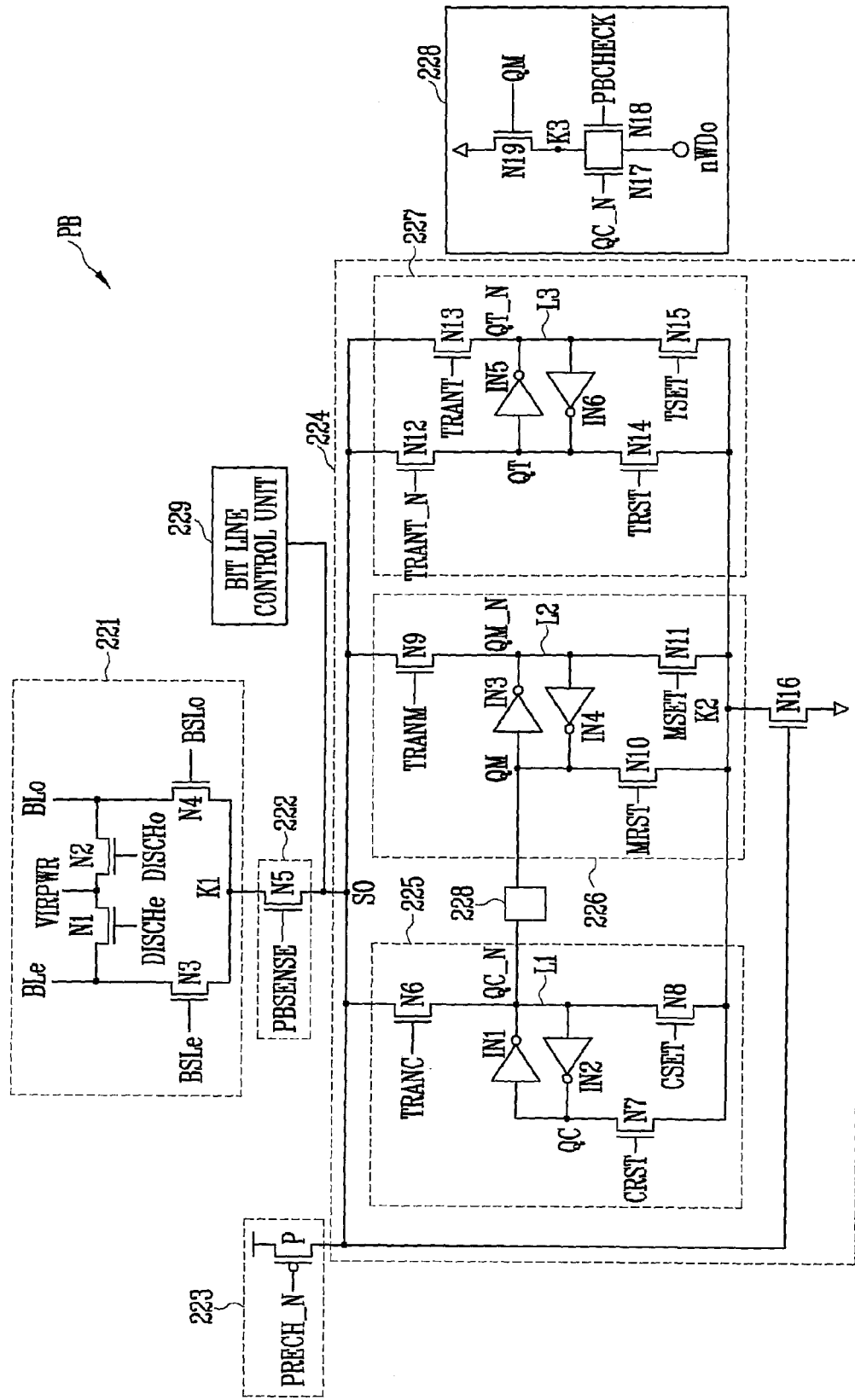
FIG. 2B is a circuit diagram of a page buffer shown in FIG. 2A.

FIG. 2B is a circuit diagram of the page buffer unit PB shown in FIG. 2A.

Referring to FIG. 2B, the page buffer PB includes a bit line selection unit 221, a sense unit 222, a precharge unit 223, a latch unit 224, a verification unit 228, and a bit line control unit 229. Furthermore, the latch unit 224 includes first to third latch circuits 225 to 227.

The bit line selection unit 221 is configured to select an even bit line BLe and an odd bit line BLo. The sense unit 222 is configured to detect the voltage of a bit line coupled thereto by the bit line selection unit 221. A result detected by the sense unit 222 is reflected at a sense node SO.

The precharge unit 223 is configured to precharge the sense node SO. The latch unit 224 includes a number of the latch circuits coupled to the sense node SO. The latch unit 224 is configured to store data, stored in memory cells, in the latch circuits according to the voltage level of the sense node SO, or store data to be programmed in the latch circuits and transfer the stored data to the sense node SO.

The latch unit 224 includes the first to third latch circuits 225 to 227. The first latch circuit 225 is configured to receive data for a cache program or temporarily store read data and output the data. Furthermore, the second latch circuit 226 and the third latch circuit 227 are configured to perform a data program.

The verification unit 228 is coupled between the first and second latch circuits 225 and 226 and is configured to output a verification signal for program verification.

Furthermore, when a program verification operation using a double verification method is performed, the bit line control unit 229 is configured to temporarily charge the voltage of a bit line according to a verification result performed using a first verification voltage PV1 and control the voltage of a selected bit line in an analog manner by supplying the selected bit line with the temporarily charged voltage in a subsequent program operation.

The bit line selection unit 221 includes first to fourth NMOS transistors N1 to N4. The sense unit 222 includes a fifth NMOS transistor N5. The precharge unit 223 includes a PMOS transistor P.

Furthermore, the first latch circuit 225 includes sixth to eighth NMOS transistors N6 to N8 and first and second inverters IN1 and IN2. The second latch circuit 226 includes ninth to eleventh NMOS transistors N9 to N11 and third and fourth inverters IN3 and IN4.

The third latch circuit 227 includes twelfth to fifteenth NMOS transistors N12 to N15 and fifth and sixth inverters IN5 and IN6. The verification unit 228 includes seventeenth to nineteenth NMOS transistors N17 to N19.

The first and second NMOS transistors N1 and N2 are coupled in series between the even bit line BLe the odd bit line BLo. A variable voltage source VIRPWR is coupled between the first and second NMOS transistors N1 and N2. The variable voltage source VIRPWR is configured to supply a power source voltage VCC for program inhibition when a program operation is performed elsewhere or voltage of 0 V for discharging. Furthermore, discharge control signals DISCHe and DISCHo are input to the respective gates of the first and second NMOS transistors N1 and N2.

The third NMOS transistor N3 is coupled between the even bit line BLe and a node K1. An even bit line selection signal BSLe is input to the gate of the third NMOS transistor N3.

The fourth NMOS transistor N4 is coupled between the odd bit line BLo and the node K1. An odd bit line selection signal BSLo is input to the gate of the fourth NMOS transistor N4.

The fifth NMOS transistor N5 is coupled between the node K1 and the sense node SO. A sense control signal PBSENSE is input to the gate of the fifth NMOS transistor N5. The fifth NMOS transistor N5 is turned on or off in response to the voltage of a bit line coupled thereto and a voltage level of the sense control signal PBSENSE. When the fifth NMOS transistor N5 is turned on or off, a voltage level of the sense node SO is changed, and so data stored in the latch unit 224 is changed.

The PMOS transistor P is coupled between a power source voltage and the sense node SO. A precharge control signal PRECH_N is input to the gate of the PMOS transistor P.

Furthermore, the sixth NMOS transistor N6 is coupled between the sense node SO and a node QC_N. A first data transmission signal TRANC is input to the gate of the sixth NMOS transistor N6.

The first and second inverters IN1 and IN2 are coupled between a node QC and the node QC_N in the form of a latch circuit, thus constituting a first latch L1.

The seventh NMOS transistor N7 is coupled between the node QC and a node K2. The eighth NMOS transistor N8 is coupled between the node QC_N and the node K2. Furthermore, a first reset signal CRST and a first set signal CSET are input to the respective gates of the seventh and eighth NMOS transistors N7 and N8.

The ninth NMOS transistor N9 is coupled between the sense node SO and a node QM_N. A second data transmission signal TRANM is input to the gate of the ninth NMOS transistor N9. Furthermore, the third and fourth inverters IN3 and IN4 are coupled between a node QM and the node QM_N in the form of a latch circuit, thus constituting a second latch L2.

The tenth NMOS transistor N10 is coupled between the node QM and the node K2. The eleventh NMOS transistor N11 is coupled between the node QM_N and the node K2. A second reset signal MRST and a second set signal MSET are input to the respective gates of the tenth and eleventh NMOS transistors N10 and N11.

The twelfth NMOS transistor N12 is coupled between the sense node SO and a node QT. The thirteenth NMOS transistor N13 is coupled between the sense node SO and a node QT_N. A third data transmission inverse signal TRANT_N and a third data transmission signal TRANT are input to the respective gates of the twelfth and thirteenth NMOS transistors N12 and N13.

The fifth and sixth inverters IN5 and IN6 are coupled between the node QT and the node QT_N in the form of a latch circuit, thus constituting a third latch L3.

The fourteenth NMOS transistor N14 is coupled between the node QT and the node K2. The fifteenth NMOS transistor N15 is coupled between the node QT_N and the node K2. A third reset signal TRST and a third set signal TSET are input to the respective gates of the fourteenth and fifteenth NMOS transistors N14 and N15.

The sixteenth NMOS transistor N16 is coupled between the node K2 and a ground node. The sense node SO is coupled to the gate of the sixteenth NMOS transistor N16.

The seventeenth and eighteenth NMOS transistors N17 and N18 are coupled between a node K3 and a verification signal output node nWDo. The gate of the seventeenth NMOS transistor N17 is coupled to a node QC_N. A page buffer check signal PBCHECK is input to the gate of the eighteenth NMOS transistor N18.

Furthermore, the nineteenth NMOS transistor N19 is coupled between a ground node and the node K3. The gate of the nineteenth NMOS transistor N19 is coupled to a node QM.

The bit line control unit 229 of the page buffer PB according to some embodiments has the following construction.

Figure 2C:
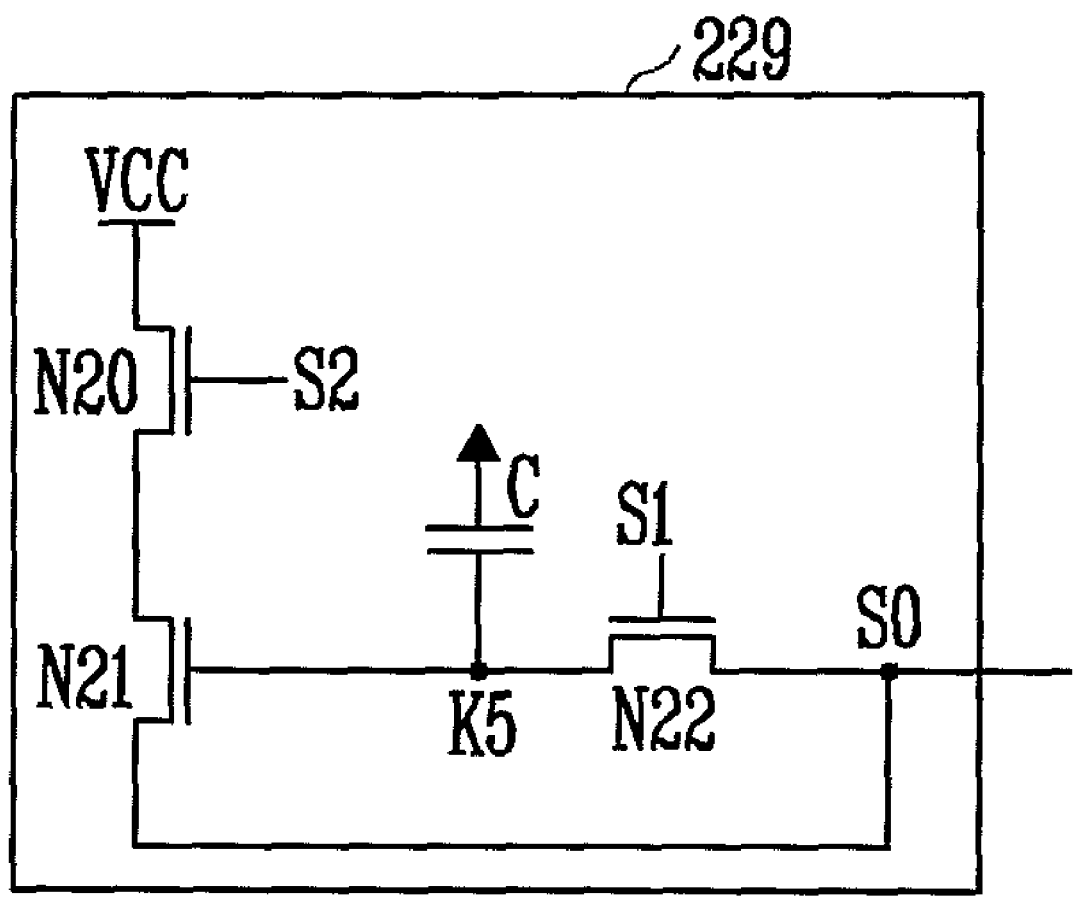
FIG. 2C is a circuit diagram of a bit line control unit shown in FIG. 2B.

FIG. 2C is a circuit diagram of the bit line control unit 229 shown in FIG. 2B.

Referring to FIG. 2C, the bit line control unit 229 functions to charge the voltage of a bit line and provide the charged bit line voltage in order to control the voltage of a bit line.

The bit line control unit 229 includes a twenty-second NMOS transistor N22 (i.e., first switching means), a twentieth NMOS transistor N20 (i.e., second switching means), a twenty-first NMOS transistor N21 (i.e., third switching means), and a capacitor C (i.e., voltage charge means). The twentieth NMOS transistor N20 is coupled to the input terminal of a power source voltage VCC.

The twentieth and twenty-first NMOS transistors N20 and N21 are coupled in series between the power source voltage VCC and the sense node SO. A transfer control signal S2 is input to the gate of the twentieth NMOS transistor N20. The gate of the twenty-first NMOS transistor N21 is coupled to a node K5.

The twenty-second NMOS transistor N22 is coupled between the node K5 and the sense node SO. A charge control signal S1 is input to the gate of the twenty-second NMOS transistor N22.

Furthermore, the capacitor C is coupled between the node K5 and a ground node.

The charge control signal S1 is applied with a logic high level in a verification process using the first verification voltage PV1 during a double verification operation, and the transfer control signal S2 is applied with a logic high level when the voltage of a bit line is controlled before a program begins.

The above-described program operation is described below with reference to FIGS. 2A to 2C.

Figure 3:
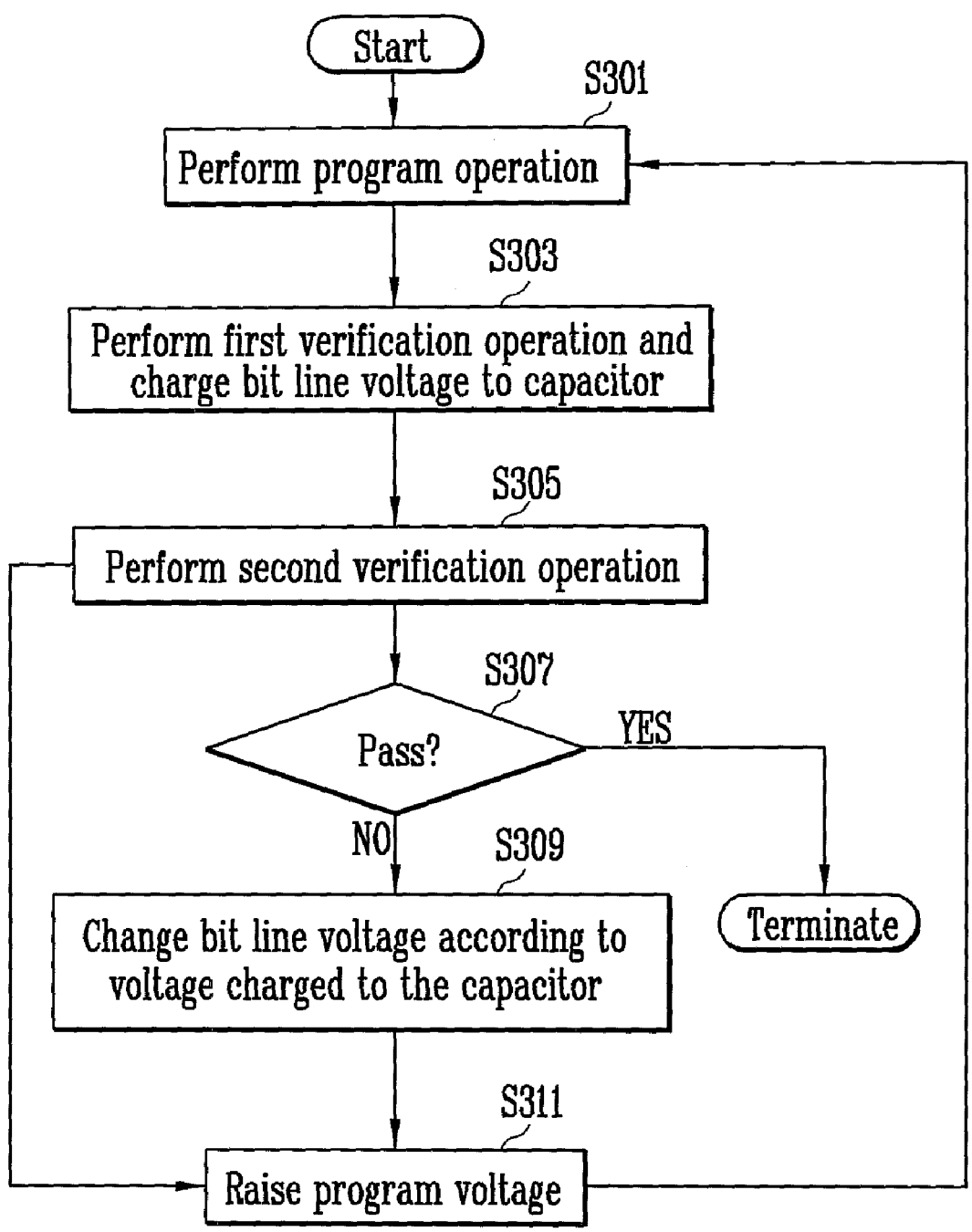
FIG. 3 is a flowchart illustrating a program operation of a nonvolatile memory device according to an embodiment.

FIG. 3 is a flowchart illustrating a program operation of the nonvolatile memory device according to an embodiment.

Referring to FIG. 3, when data to be programmed and address information together with a program command are input, the control unit 260 selects a bit line and a word line based on the address information and latches the data to be programmed in the second latch L2 of the page buffer PB via the node QM_N.

Next, the control unit 260 performs a program operation in the state in which a program voltage is applied to the selected word line and a pass voltage is applied to unselected word lines at step S301. Here, an operation of the page buffer according to the program operation is known in the art, and a detailed description thereof is omitted.

After the program operation is performed, a program verification operation is carried out. A double verification operation is performed according to the present embodiment.

A first verification operation is performed using a first verification voltage PV1 at step S303. The first verification operation is performed as follows.

First, for the first verification operation, the precharge control signal PRECH_N having a logic low level is applied. When the precharge control signal PRECH_N is applied with the logic low level, the PMOS transistor P is turned on. Accordingly, the sense node SO is precharged to the logic high level.

The bit line is precharged by applying the bit line with the sense control signal PBSENSE of the sense unit 222 with a logic high level. Next, the first verification voltage PV1 is applied to the selected word line, and a pass voltage is applied to the remaining word lines. In the state in which the fifth NMOS transistor N5 is turned off, after the time that it takes to change the voltage of the bit line according to a program degree of memory cells of the selected word line elapses (an evaluation time), the voltage state of the bit line is sensed by applying the sense control signal PBSENSE with a logic high level.

When the charge control signal S1 is applied with a logic high level while the voltage of the bit line is being sensed, the twenty-second NMOS transistor N22 is turned on. When the twenty-second NMOS transistor N22 is turned on, the capacitor C is precharged according to the voltage of the bit line.

Here, if the selected memory cells are programmed to have threshold voltages comparatively lower than the first verification voltage PV1, the voltage of the bit line is comparatively lower. Accordingly, voltage precharged at the capacitor C is comparatively low.

However, if the selected memory cells are programmed to have threshold voltages higher than the first verification voltage PV1, the voltage of the bit line is comparatively higher (for example, higher than the comparatively low voltage). Accordingly, voltage precharged at the capacitor C is high.

After the capacitor C is precharged according to the voltage of the bit line as described above, a second verification operation using a second verification voltage PV2 is carried out at step S305.

It is then determined whether a result of the second verification operation is a pass at step S307. If, as a result of the second verification operation, the second verification operation is determined to be a pass, a corresponding program operation is terminated. However, if, as a result of the second verification operation, the second verification operation is determined to be a fail, a program voltage is raised by as much as a step voltage according to an ISPP method, and the program operation is performed again.

Here, before the program operation is performed, an operation of precharging the bit line according to a data status of the second latch L2 is performed. That is, when the data of the node QM_N of the second latch L2 is '0', the bit line is not precharged. When the data of the node QM_N is '1', the bit line is precharged. In the case where the bit line is precharged, the program operation is inhibited through voltage boosting.

Here, the transfer control signal S2 is applied with a logic high level. When the transfer control signal S2 is applied with the logic high level, the twentieth NMOS transistor N20 is turned on. Furthermore, a degree to which the twenty-first NMOS transistor N21 is turned on is controlled according to a voltage level charged at the capacitor C.

In other words, when the voltage level charged at the capacitor C is high, the twenty-first NMOS transistor N21 is relatively strongly turned on, and most of the power source voltage input through the twentieth NMOS transistor N20 is applied to the sense node SO. However, when the voltage level charged at the capacitor C is low, the twenty-first NMOS transistor N21 is relatively weakly turned on, and only part of the power source voltage input through the twentieth NMOS transistor N20 is applied to the sense node SO. Further, the voltage applied to the sense node SO is transferred to the bit line.

Accordingly, the voltage of the bit line is controlled according to the voltage level charged at the capacitor C at step S309. Further, the control of voltage is based on an analog method not a digital method, and voltage controlled according to a program state of memory cells is precharged to the bit line.

After the bit line is precharged as described above, a program voltage that is raised according to the ISPP method is applied at step S311, and the program operation is performed again.

Here, since the voltage of the bit line is differently precharged according to the program degree of the memory cells, a speed at which the memory cells are programmed according to a program state can be controlled.

For example, in a case where the selected memory cells are programmed to have a threshold voltage value close to the first verification voltage PV1, the program speed is controlled as follows.

When the first verification operation using the first verification voltage PV1 is performed on the selected memory cells at step S303, the bit line is stably maintained at voltage precharged in the early verification operation. That is, the voltage of the bit line is high.

The voltage is charged at the capacitor C by applying the charge control signal S1. Next, when a program operation is performed, the transfer control signal S2 is applied in the bit line precharge step, thereby turning on the twentieth NMOS transistor N20. A degree to which the twenty-first NMOS transistor N21 is turned on is relatively large due to the voltage charged at the capacitor C.

Accordingly, the power source voltage transferred through the twentieth NMOS transistor N20 is applied to the sense node SO according to the degree to which the twenty-first NMOS transistor N21 is turned on. As described above, since the twenty-first NMOS transistor N21 is relatively strongly turned on, the level of voltage applied to the sense node SO is high.

Accordingly, the bit line is also precharged to a high voltage level. Here, the voltage level precharged to the bit line is relatively weakly to the extent that the program operation for the bit line is not inhibited by boosting and has a voltage level to the extent that the program speed becomes comparatively slow. A value for the voltage level which can make the program speed comparatively slow can be obtained through experiments. Voltage, enabling the bit line to be precharged with the obtained voltage level, can be controlled so that the voltage is input to the seventeenth NMOS transistor N17 instead of the power source voltage VCC.

When the voltage of the bit line becomes high, the program speed of the memory cells becomes comparatively slow. Accordingly, a program speed of the memory cells having threshold voltages higher than the first verification voltage PV1 or substantially identical to the first verification voltage PV1 can be controlled in an analog manner according to the voltage level charged at the capacitor C. Consequently, while a program operation for comparatively slow-programmed memory cells is being completed, the comparatively slow-programmed memory cells can be controlled so that they are not over-programmed.

Furthermore, if the above method is used, the latch circuits of a page buffer required in a method of performing double verification through control of the voltage of a bit line is not necessary. In general, since a latch circuit for additionally storing the first verification operation result is required for the double verification operation, a problem arises because the number of latches constituting the page buffer increases. However, by using the above-described method, a latch for the first verification operation may not be required.

As described above, according to the page buffer circuit, the nonvolatile memory device including the page buffer circuit, and the method of operating the nonvolatile memory device, when a double verification operation is performed, the voltage of a bit line is controlled in an analog manner according to a program state of memory cells. Accordingly, a width of threshold voltages can be narrowed by controlling a program speed of memory cells with different program speeds.

What is claimed is:

1. A nonvolatile memory device, comprising:
a memory cell array comprising a number of memory blocks each including memory cells for storing data, the memory cells being coupled by a bit line and a word line;
a page buffer unit, comprising page buffers coupled to the bit line and configured to include a plurality of latch circuits for latching data to be programmed into the memory cells or storing data from the memory cells, wherein each of the page buffers comprises a bit line control unit configured to temporarily charge a voltage of a bit line varying according to a program degree of memory cells when a program verification operation is performed and to provide the bit line with the charged voltage when a program operation for the bit line is performed; and
a control unit configured to control a program, read, or erase operation, charge a voltage of a bit line according to a verification result to the page buffer when a program verification operation is performed using a double verification method, and apply the bit line with the voltage charged at the page buffer when a program operation is performed.

2. The nonvolatile memory device of claim 1, wherein each of the page buffers of the page buffer unit comprises:
a bit line selection unit configured to select the bit line;
a latch unit, comprising a plurality of latch circuits coupled to a sense node and configured to latch data to be programmed into the memory cells or store data from the memory cells; and
the bit line control unit coupled to the sense node and configured to temporarily charge a voltage of the selected bit line in response to charge and transfer control signals or transfer the charged voltage to the selected bit line.

3. The nonvolatile memory device of claim 2, wherein the bit line control unit comprises:
voltage charge means for charging the voltage of the selected bit line;
a first switching element coupled between the sense node and the voltage charge means and configured to connect the sense node and the voltage charge means in response to the charge control signal;
a second switching element coupled to an input terminal of a power source voltage; and
a third switching element configured to, when the second switching element transfers the power source voltage to the sense node in response to the transfer control signal, change the degree to which the third switching element is turned-on according to a voltage level charged at the voltage charge means, thus changing a voltage level transferred to the sense node.

4. A method of operating a nonvolatile memory device, the method comprising:
- a first program step of performing a program operation using a first program voltage;
- a first verification step of performing a first verification operation on selected memory cells using a first verification voltage and temporarily charging a voltage of a bit line coupled to the selected memory cells;
- a second verification step of performing a second verification operation using a second verification voltage higher than the first verification voltage;
- a bit line voltage change step of, if a result of the second verification operation is not a pass, precharging the bit line in proportion to the temporarily charged voltage; and
- a second program step of performing a program operation using a second program voltage higher than the first program voltage by as much as a step voltage.

5. The method of claim 4, further comprising, after the second program step, performing the first verification operation and the second verification operation, and if a result of the second verification operation is not a pass, performing a third program operation using a third program voltage higher than the second program voltage by as much as the step voltage after the bit line voltage change step.

6. The method of claim 5, wherein, if a result of the second verification operation is a pass, a program operation is terminated.

* * * * *